United States Patent
Matsuki et al.

(10) Patent No.: US 6,693,790 B2
(45) Date of Patent: Feb. 17, 2004

(54) STATIC ELECTRICITY CHUCK APPARATUS AND SEMICONDUCTOR PRODUCING APPARATUS PROVIDED WITH THE STATIC ELECTRICITY CHUCK APPARATUS

(75) Inventors: Teruyuki Matsuki, Kanagawa-ken (JP); Motohide Sugihara, Kanagawa-ken (JP); Kanichi Kadotani, Kanagawa-ken (JP)

(73) Assignee: Komatsu, Ltd., Tokyo (JP)

( * ) Notice: Subject to any disclaimer, the term of this patent is extended or adjusted under 35 U.S.C. 154(b) by 8 days.

(21) Appl. No.: 10/121,557

(22) Filed: Apr. 12, 2002

(65) Prior Publication Data

US 2002/0167781 A1 Nov. 14, 2002

(30) Foreign Application Priority Data

| Apr. 12, 2001 | (JP) | 2001-113589 |
| Jun. 7, 2001 | (JP) | 2001-172509 |
| Jun. 27, 2001 | (JP) | 2001-195256 |
| Jan. 10, 2002 | (JP) | 2002-003598 |

(51) Int. Cl.[7] .................................................. H01L 21/68
(52) U.S. Cl. ................................... 361/234; 361/233
(58) Field of Search ........................... 361/233, 234

(56) References Cited

U.S. PATENT DOCUMENTS 5,452,177 A * 9/1995 Frutiger ................ 361/234
5,631,803 A * 5/1997 Cameron et al. ...... 361/234
6,490,144 B1 * 12/2002 Narendrnath et al. .. 361/234
2002/0141134 A1 * 10/2002 Frutiger ................ 361/234

FOREIGN PATENT DOCUMENTS

| JP | 06-349938 | 12/1994 |
| JP | 07-106300 | 4/1995 |
| JP | 07-335630 | 12/1995 |
| JP | 09-298233 | 11/1997 |
| JP | 11-163109 | 6/1999 |
| JP | 2000-113850 | 4/2000 |
| JP | 2000-286332 | 10/2000 |

* cited by examiner

*Primary Examiner*—Anthony Dinkins
*Assistant Examiner*—Eric Thomas
(74) *Attorney, Agent, or Firm*—Bell, Boyd & Lloyd LLC

(57) ABSTRACT

Insulative viscous fluid or gel material having low hardness is used for at least a first electricity insulating layer as an insulating layer of a static electricity chuck. Since a holding surface of the first electricity insulating layer is deformed in accordance with a back surface shape of a wafer, a substantially entire surface of the holding surface comes into intimate contact with the wafer uniformly. An exposing surface of the electricity insulating layer may be coated with a second electricity insulating layer having corrosion resistance. With this structure, adhesion between the back surface of the wafer and the static electricity chuck apparatus is enhanced, which reduces the contact thermal resistance, and it is possible to obtain a static electricity chuck apparatus which is capable of controlling temperature of a surface of the wafer with high precision and has high plasma resistance and durability.

15 Claims, 10 Drawing Sheets

FIG. 2
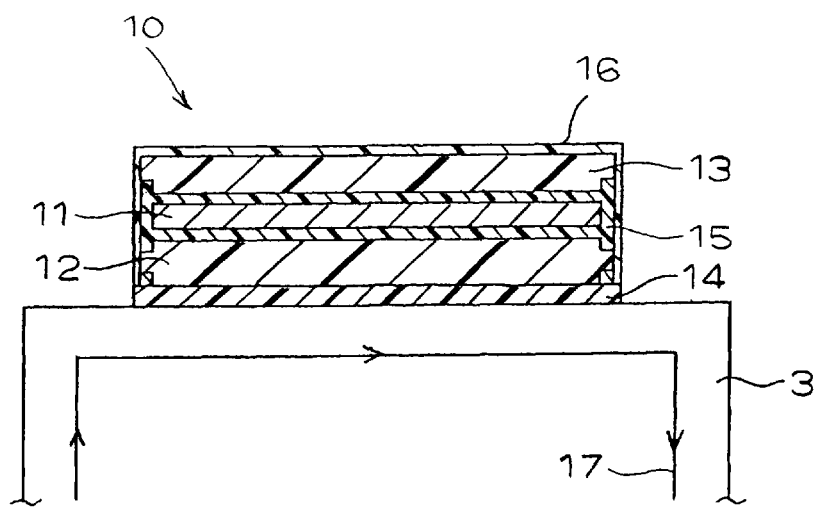
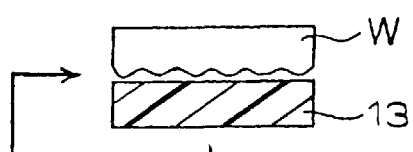
FIG. 3A
FIG. 3B
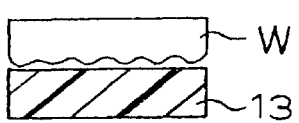
FIG. 3C
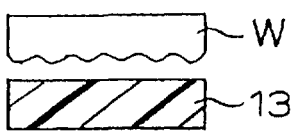
FIG. 3D

STATIC ELECTRICITY CHUCK APPARATUS AND SEMICONDUCTOR PRODUCING APPARATUS PROVIDED WITH THE STATIC ELECTRICITY CHUCK APPARATUS

BACKGROUND OF THE INVENTION

1. Field of the Invention

The present invention relates to a static electricity chuck apparatus and a semiconductor producing apparatus having the static electricity chuck apparatus for absorbing and holding a semiconductor substrate which can be preferably applied to various film-forming processes, plasma etching processes, ion implantation processes, ion doping processes, and the like in production of a semiconductor device, and the invention also relates to a static electricity chuck apparatus and a semiconductor producing apparatus having the static electricity chuck apparatus which can control a temperature of a surface of an absorbed body and which has excellent heat transfer performance and durability, and which has high adhesion with respect to a work piece.

2. Description of the Related Art

Conventionally, in a producing process of a semiconductor device, static electricity chuck is used for holding a semiconductor substrate in a film forming apparatus for forming a thin film on the semiconductor substrate, an etching apparatus for making fine work, or an ion doping apparatus. In this static electricity chuck, an electrode is embedded in an insulating layer, its upper surface is defined as a holding surface of the substrate, direct current is applied between the electrode and the substrate placed on the holding surface so that absorbing force called Coulomb force by dielectric polarization or Johnson-Rahbeck force by fine leakage current is generated, and the substrate is absorbed and held by the holding surface.

According to Japanese Patent Application Laid-open No. 6-349938 for example, a wafer which is a work piece is absorbed and held by static electricity by a static electricity chuck sheet on a susceptor provided in a hermetic processing chamber. A wafer absorbing surface of the static electricity chuck sheet is provided with a plurality of gas supplying holes, inert gas such as He supplied from the gas supplying holes is dispersed into a gas dispersion groove formed between the static electricity chuck sheet and the wafer, and the gas is exhausted from an exhaust hole through a gas recovering groove formed in an outer periphery of the gas dispersion groove. By enhancing the specific thermal conductivity between the wafer and the static electricity chuck sheet, a temperature distribution difference of the wafer is suppressed, gas is prevented from leaking, and the wafer is processed with high precision.

According to Japanese Patent Application Laid-open No. 7-335630 for example, a gap between a wafer and a stage of a static electricity chuck having heating or cooling function is not set uniformly, and mixture gas comprising gas of excellent thermal conductivity and gas of inferior thermal conductivity such as He gas and Ar gas is introduced into the gap. By changing the mixture ratio of gases, a distribution of overall heat transfer coefficient between the wafer and the stage is changed and temperature distribution of the wafer is changed, or a contact surface or space between the wafer and the stage is divided into a plurality of regions, and temperature distribution of the wafer is changed by individually controlling gas pressure in each region. With this structure, the wafer is uniformly heated and cooled, the wafer temperature can be made uniform at the time of production of the semiconductor device, and a semiconductor device which is finer and has high performance can be produced.

As an electricity insulating layer of the static electricity chuck, it is proposed to use ceramic such as alumina and high polymer material such as polyimide and silicone rubber, and such an insulating layer has partially been brought into actual use as described in Japanese Patent Applications Laid-open No. 7-106300, No. 9-298233, No. 2000-113850, and No. 2000-286332.

According to the Japanese Patent Application Laid-open No. 7-106300, an exposing surface of the electricity insulating layer comprising high polymer organic film is coated with fluoroplastics to enhance the plasma resistance of the electricity insulating layer. According to Japanese Patent Application Laid-open No. 2000-113850, various ceramics or glasses are used for the electricity insulating layer, and the exposing surface is coated with silicone resin such as PFTE, methylphenyl vinyl and phlorosilicone, which has resistance to plasma and excellent heat resistance, chemical resistance and aging resistance, as anti-corrosive insulating film.

In Japanese Patent Application Laid-open No. 2000-286332, a metal conductive film is coated with a pair of insulating films such as polyimide resin film so that the conductive film is sandwiched from its opposite surfaces over the entire surface. An upper surface and all side surface of the chuck body obtained in this manner and a surface of a periphery of the chuck body of a mounting stage on which the chuck body is placed and fixed are coated with protecting film comprising tetrafluoride resin or trifluoride resin, and an exposing surface of the periphery of the chuck body of the mounting stage is further coated with a protecting ring.

With this structure, it is described that corrosion is not generated on the static electricity chuck and periphery of its mounting stage by any etching such as down flow-type etching and reactive ion etching, and life of the static electricity chuck apparatus is not shortened.

Japanese Patent Application Laid-open No. 9-298233 discloses a static electricity chuck in which an electrode is disposed on a first insulating layer comprising heat conductive silicone rubber on a metal support plate, a second insulating layer comprising heat conductive silicone rubber having hardness of 85 or lower and surface roughness of 5 μm or lower is formed on the electrode to dissipate heat, adhesion between the electrode and the substrate is enhanced, contact thermal resistance is suppressed to lower level, and a temperature of the substrate is set uniformly and constantly with high precision.

According to Japanese Patent Application Laid-open No. 2000-113850, an electricity insulator of a static electricity chuck is made of silicone rubber, an electricity insulating film such as diamond-like carbon, fluoroplastics and polyimide, which has higher mold releasing performance than silicone rubber has, is formed on a surface of this electricity insulator made of silicone rubber, and separating performance of the wafer is enhanced without lowering heat transfer performance between the wafer and the static electricity chuck.

Moreover, according to Japanese Patent Application Laid-open No. 11-163109, the static electricity chuck constitutes a wafer holding apparatus which comprises a wafer holding base body whose upper surface of ceramic body having an inside electrode constituting a static absorbing electrode, a heater electrode, and plasma generating electrode is holding surface of the wafer; and a base body comprising a porous ceramic body whose thermal expansion difference between the wafer holding base body and the ceramic body constituting the wafer holding base body is $3\times10^{-6}/°$ C. or lower and having a pore into which metal is charged. The base body is bonded to a lower surface of the wafer holding base body through wax material mainly comprising aluminum, thereby constituting the wafer holding apparatus. Therefore, when the base body is bonded to a metal temperature control apparatus having cooling or heating function, it is possible to bond them strongly without deteriorating heat transfer characteristics of the bonded portions.

By the way, like the static electricity chuck disclosed in Japanese Patent Application Laid-open No. 11-163109, if the wafer holding surface is constituted by ceramic, the ceramic is obtained by sintering powder, and solids having high hardness come into contact with each other. Therefore, a gap as small as micro unit is generated in the contact surfaces between the wafer and the wafer holding surface, contact thermal resistance is increased, and since air in the gap disappears in vacuum environment, the contact thermal resistance is further increased, and the heat transfer performance is lowered.

The static electricity chuck disclosed in Japanese Patent Application Laid-open No. 7-335630 is accomplished to avoid the above-described deficiency caused when the wafer holding surface is held by the ceramic, inert gas such as He gas is supplied to the gap generated between the ceramic and wafer at the time of vacuum, thereby enhancing the heat transfer characteristics. For this purpose, however, it is necessary to install a gas supply apparatus, a structure of the entire apparatus is complicated and increased in size, and in order to supply two kinds of gases and to make the temperature distribution of the wafer uniform by controlling the gas supply region, the mechanism is further complicated, and it is impossible to make practical use of such an apparatus.

Meanwhile, like Japanese Patent Application Laid-open No. 9-298233, silicone rubber is used instead of ceramic, and heat conductive silicone rubber which has flexibility as low as hardness 85 or lower and has surface roughness of 5 $\mu$m or lower is used as a second insulating layer which constitutes the wafer holding surface, thereby obtaining conformability with respect to the wafer and securing heat radiation characteristics, and the temperature distribution of the wafer is uniformed. However, the hardness of the silicone rubber is lowered and adhesion performance is increased, the wafer is less prone to be separated, and since anti-corrosion characteristics are inferior, durability is poor. Moreover, the silicone rubber has poor plasma resistance and durability, and it is difficult to actually use the silicone rubber for an etching apparatus and thus, the silicone rubber is limited to a partial usage such as an ion implantation apparatus.

According to the static electricity chuck of Japanese Patent Application Laid-open No. 2000-113850, to avoid the above-described deficiency caused by the adhesion of the silicone rubber, an electricity insulating film such as diamond-like carbon, fluoroplastics and polyimide which is easily released from mold is formed on a surface of the silicone rubber constituting the wafer holding surface, but it is not easy to form the insulating film made of such material, and attention is paid only to easiness of mold releasing operation with respect to a wafer and thus, a side surface is still exposed to processing atmosphere. Therefore, durability, especially durability in plasma atmosphere, can not be expected.

Further, in order to enhance the plasma resistance, if a surface of a static electricity chuck made of silicone rubber is coated with material having high hardness such as diamond-like carbon (DC), fluoroplastics, and polyimide, contact thermal resistance is adversely increased if the hardness of the chuck is increased to about the same as that of the silicone rubber, heat transfer performance can not be enhanced as expected. As a result, it is impossible to coat having sufficient thickness to withstand the plasma and in actuality, it is impossible to use it for the etching apparatus.

In the static electricity chuck apparatus of Japanese Patent Application Laid-open No. 2000-286332, a surface of an insulating parent material comprising polyimide resin is coated with a protecting film made of tetrafluoride resin or trifluoride resin, but compatibility between polyimide resin and fluoroplastics is low, and durability is poor even if they are bonded through adhesive.

The present invention has been accomplished in view of the above problems, and it is a concrete object to provide a static electricity chuck apparatus in which conformability between a holding surface of a work piece and the workpiece is enhanced at the time of various processing, the workpiece can be brought into intimate contact and held effectively without generating a gap therebetween, the workpiece can easily be separated from the holding surface, the heat transfer performance between the workpiece and the holding surface is enhanced, and corrosion resistance is excellent. Other objects will be apparent from the following explanation.

SUMMARY OF THE INVENTION

A basic structure of the present invention is a static electricity chuck apparatus in which an electrode is disposed in an insulating layer disposed on a metal support plate, and an upper surface of the insulating layer is absorbed and held by static electricity as a holding surface of an absorbed body, wherein the insulating layer disposed at least on an upper surface side of the insulating layer covering the electrode is made of viscous fluid or low hardness gel body.

If viscous fluid or gel body having low hardness is employed as a portion of the electricity insulating layer, it is possible to bring the substrate holding surface of the static electricity chuck into intimate contact with the back surface of the substrate uniformly, utilizing physical properties that the viscous fluid or gel body having low hardness is deformed in accordance with its mating material shape. It is possible to substantially eliminate a vacuum layer from the contact interface even under vacuum environment at the time of etching for example, and the contact thermal resistance is reduced and high heat conductivity is secured.

Here, examples of the viscous fluid are various grease and silicon oil having thermal conductivity of one or higher. Preferable material of the gel body is high polymer material, and preferable examples of the material are silicon gel, polyurethane gel and epoxy gel. Normal gelation of high polymer material is generated when crosslinkings are formed when monomers including multi-functional group generate condensation reaction or when high polymer dissolved matter generates intermolecular reaction by crosslinking agent, ionic bond and the like, or hydrogen bonds or hydrophobic bonds between solutes. The gel body in the present invention is not limited to material which is geleted and maintains a stable gel state, but the gel body may mainly comprise high polymer material whose phase is changed reversibly between solid phase and liquid phase depending upon peripheral condition.

It is preferable that a surface of the electrode is subjected to compatibility processing with respect to the insulating layer. For example, the adhesion performance between metal and the insulating layer made of vinilidene fluoroplastics is high as compared with other fluoroplastics, but in order to further enhance the adhesion, when aluminum electrode is used, for example, the surface of the electrode may be subjected to almite processing, and the surface of a copper electrode is subjected to trazine processing. By carrying out such surface treatment, it is possible to remarkably enhance the adhesion between resin, which mainly comprises vinilidene fluoride, and the electrode.

Preferably, the gel material having low hardness or viscous fluid is mainly made of high polymer material whose phase is changed reversibly between solid phase and liquid phase depending on peripheral conditions, and the gel material is semi-fluidized or fluidized when the absorbed body is absorbed, and the absorbed body is brought into intimate contact and held uniformly.

When the high polymer material is thermoplastic resin material, it is softened or melted at a temperature (softening point or melting point) inherent to the material, thus semi-fluidized or fluidized, and is solidified at a temperature lower than the said temperature. The softening point or the melting point is varied depending upon material, and the material may be burned or deteriorated depending upon the processing temperature in some cases. Or, physical properties may be changed depending upon electrical processing condition. Therefore, in the present invention, it is necessary to select the high polymer material taking into account the processing temperature or electromagnetic condition at the time of static electric absorption.

A preferable high polymer material is thermoplastic resin material, and examples of the material are hydrocarbon-based synthetic resin such as various polyethylene, polypropylene, polymethyl pentene, crystalline polybutadiene and isostatic polystyrene; condensation synthetic resin such as polyacetal, various polyamide, various polyterephthalate and polyvinyl alcohol; non-crystal synthetic resins such as polyvinyl chloride, polyvinyl acetate, polymethyl methacrylate, ethylene tetrafluoroethylene copolymer; line structure resin such as polyimide, polyamide imide and polyether ketone; and various plastic alloy.

Important points of the present invention are that resin material of the second insulating layer constituting the holding surface of the absorbed body at the time of the static adsorption is semi-fluidized or fluidized, and the insulating layer must be solidified at the non-processing time other than static adsorption time. For example, if a processing temperature at the time of static adsorption exceeds the softening point or melting point of the resin material, the second insulating layer is semi-fluidized or fluidized, deformed along the holding surface of the absorbed body with large freedom, and comes into intimate contact with the entire holding surface of the absorbed body without gap. If the processing is completed and a peripheral temperature becomes lower than the softening point or melting point of the resin material, the insulating layer is solidified.

In the present invention, it is necessary to pay attention also to the adhesion between the resin material and the absorbed body. If the adhesiveness is strong, the resin material is solidified adhering to the absorbed body after the processing, it becomes difficult to peel off the absorbed body from the absorbing surface, and the absorbed body may be damaged in some cases. Therefore, when the absorbing surface of the second insulating layer is directly made of high polymer material, material having poor adhesion strength with respect to other material such as polymethyl pentene is used. In this regard, since the melting point of the polymethyl pentene is 230° C. to 240° C., extremely high among high polymer material, it can withstand the high temperature processing with respect to the absorbed body.

If gel material of low hardness or viscous fluid is employed as a portion of the electricity insulating layer, it becomes possible to bring the substrate holding surface of the static electricity chuck into intimate contact with the back surface of the substrate, utilizing the physical properties that gel material of low hardness or viscous fluid deforms along the shape of the mating material. Thus, it becomes possible to substantially eliminate a vacuum layer from the contact interface even under vacuum environment at the time of etching, for example, and the contact thermal resistance is reduced and high heat conductivity is secured.

Here, examples of the viscous fluid are various grease and silicon oil having thermal conductivity of one or higher. Preferable material of the gel body is high polymer material, and preferable examples of the material are silicon gel, polyurethane gel and epoxy gel. Gelation of high polymer material is generated when crosslinkings are formed when monomers including multi-functional group generate condensation reaction or when high polymer dissolved matter generates intermolecular reaction by crosslinking agent, ionic bond and the like, or hydrogen bonds or hydrophobic bonds between solutes. The gel body in the present invention is not limited to material which is geleted and which maintain a stable gel state, and the gel body may mainly comprises high polymer material whose phase is changed between solid phase and liquid phase depending upon peripheral condition in a reversal manner. Among the above gel high polymer materials, silicon gel is most preferable because of the following excellent characteristics.

The basic structure of silicon gel consists of dimethyl siloxane polymer mutually crosslinking by chemical bonding, thereby silicon gel has intermediate characteristics between the silicone rubber and silicon oil, and is a much softer than rubber and is a material having shape-keeping characteristics.

Crosslink density of silicone gel is controlled to $1/3$ to $1/10$ of normal silicone rubber. Further, there is no hydrogen bond between water molecule and polar group unlike general hydrogel, and the polymer skeleton is thermally stable, thus gel state is maintained in wide temperature range. Moreover, this silicon gel has following characteristics: 1) temperature dependency of physical properties is low and there is heat resistance, 2) mechanical strength is relatively high, 3) viscoelastic characteristics can be controlled and formation is easy, and 4) electrical characteristics and weather resistance are excellent.

The low hardness gel high polymer material used in the present invention need to have low hardness and low elastic modulus so that contact thermal resistance can be reduced, and it is preferable that JIS K6301 hardness is 10 or lower and JIS K2207 penetration number is 5 or higher, more preferably, 50 to 200.

If the thickness of the gel high polymer material is too thin, the mechanical strength and insulating damaging voltage are lowered, which is not always effective for reducing the contact thermal resistance. On the other hand, if it is too thick, the thermal resistance is increased correspondingly. According to an experiment, it was found that optimal value was obtained under certain thickness of the gel high polymer material. The thickness is preferably 0.1 to 2 mm. Especially when it is used as the static electricity chuck, since its absorbing force inversely proportional to square of thickness of the dielectric layer, it is preferable that the thickness is 1 mm or less.

When all the electricity insulating layer is made of gel body having low hardness, it is preferable that the gel body at this time is obtained by gelating the high polymer material as described above. In the static electricity chuck having electricity insulating layer of gel body alone as in the present invention, the electricity insulating layer has the shape-keeping characteristics and is extremely flexible and thus, if the substrate is placed and held, the holding surface of the electricity insulating layer is deformed along bumps and dips of the back surface of the substrate, as described above, and is brought into intimate contact over substantially entire surface. Therefore, the contact thermal resistance between the substrate and the absorbing surface can be suppressed to a low value. As a result, cooling efficiency is enhanced, a temperature of the substrate is controlled efficiently and precisely, and thus it is possible to lower the temperature of the substrate and to save energy of the cooling apparatus.

Further, according to the static electricity chuck, as described above, since it is possible to suppress the thermal resistance to an extremely low level, heat transfer performance is excellent even in vacuum, and heat-transfer cooling gas promoting, which is conventionally used, becomes unnecessary. In addition, gel material can provide higher heat conductivity if heat conductive filler is added. Examples of the heat conductive filler to be added to the gel material are alumina, aluminum nitride, boron nitride and silicon nitride.

It is preferable that the thermal conductivity is 1 W/m·K or higher, and an example of a sheet formed product of silicon gel is λ gel (produced by GelTech, Inc.) (thermal conductivity 6.5 W/m·K).

On the other hand, examples of the electrode material are metal conductor such as copper, aluminum, nickel, silver and tungsten, and ceramic such as titanium nitride.

In the present invention, it is preferable that the insulating layer comprises at least two layers, at least one inner layer is made of gel body having low hardness or viscous fluid, and the outer exposing surface is coated with hardening film of energy beam hardening mordant.

This energy beam hardening mordant has excellent adhesion force with respect to the absorbed body before energy beam is radiated, but if the energy beam is radiated and the mordant is hardened, the adhesion force is extremely lowered. Thus, the absorbed body can easily be peeled off from the absorbing surface of the static electricity chuck.

As disclosed in Japanese Patent Application Laid-open No. 2000-129227, examples of acrylic mordant, which is one of main components of energy beam hardening mordant, are trimethylol propane triacrylate, tetramethylol methane tetraacrylate, pentaerythritol triacrylate, depentaerythritol triacrylate, 1,4-butylene glycol diacrylate, 1,6-hexane diol diacrylate and polyethylene glycol diacrylate. An example of energy beam polymer compound, which is another main component of energy beam hardening mordant, is urethane acrylate oligomer.

The present inventors studied about material of synthetic resin material suitable for an insulating layer of electricity chuck, wherein the resin, though it has never been used in the field of art, has excellent electric insulating characteristics, can secure adhesion with respect to the substrate, and can easily be separated from the substrate. As a result, the inventors found that as a synthetic resin material having such physical properties, a synthetic resin material resin comprising vinilidene fluoride as main component is optimal.

Examples of synthetic resin material resin comprising vinilidene fluoride as main component are copolymer between vinilidene fluoride and ethylene trifluoride, copolymer between vinilidene fluoride and propylene hexafluoride, and copolymer between vinilidene fluoride and perfluoro vinyl ether. These copolymers comprising vinilidene fluoride as main component can generate high dielectric even in non-roll and thus, production is easy, and absorbing force is excellent. On the contrary, normal vinilidene fluoroplastics does not exhibit dielectric unless it is rolled, and production is not easy.

In the present invention, the insulating layer comprises at least two layers, at least one of these layers is gel body having low hardness or viscous fluid, and an outer surface of the layer is coated with a second insulating layer having at least corrosion resistance.

Examples of the second insulating layer which can be used in the present invention are polyimide resin and fluoroplastics. Examples of the polyimide resin are not only all aromatic polyimide (PI) which is condensation reaction type and non thermoplastic non-thermoplastic, but also thermoplastic polyimide, polyether imide (PEI) and polyamide imide (PAI) which are additive reaction type thermoplastic polyimide. Examples of fluoroplastics are PTFE, PFA, ETFE and FEP, and PTFE and PFA, which are chemically stable, are especially preferable.

When the insulating layer is made of the synthetic resin material comprising the vinilidene fluoride as main component, it is preferable that its surface is further coated with PTFE (polytetrafluoroethylene resin layer) as the second insulating layer. In this case, it is especially effective when the plasma is used for working the semiconductor producing apparatus.

Meanwhile, it is possible to coat the electricity insulating layer comprising gel body with PFA, then coat the surface with PTFE or coat the electricity insulating layer comprising gel body with PTFE, subsequently coat the surface with polyimide resin to make three layer structure. In such a way, multi-layered structure, in which the anti-corrosive insulating layer is freely combined on the outermost layer, may be employed.

It is preferable that the thickness of the second insulating layer is thin in view of the contact thermal resistance, but if the thickness is too thin, the layer can not sufficiently function as a protecting film, and mechanical strength is also lowered. Especially when gel high polymer material of low hardness is used for the first insulating layer as in the static electricity chuck of the present invention, if the film thickness of the protecting film is 10 μm or less, its strength cannot withstand the actual use, and at the same time, corrosion resistance becomes insufficient. On the other hand, if the film thickness exceeds 50 μm, the hardness of the protecting film becomes high, the electricity insulating layer made of gel body does not deform as expected, the contact thermal resistance between the second insulating layer and the substrate becomes high, and heat transfer performance as expected cannot be obtained.

By optimizing hardness and resilience of the electricity insulating layer made of gel body and film thickness of the anti-corrosive second insulating layer coated with the said electricity insulating layer, it is possible to obtain high heat transfer performance, and to enhance the durability without deteriorating the cooling characteristics of the substrate.

While fluoroplastics other than polytetrafluoroethylene and other engineering resin are etched by ion, polytetrafluoroethylene, which has dielectric function, has small deviation of electron in molecule and thus, it is not etched by ion at the time of plasma etching. Nor it is not etched by radical. Further, normal polytetrafluoroethylene cannot be formed without sintering, and a defect such as pin hole is generated. The water dispersion type low molecular weight polytetrafluoroethylene resin has good adhesion with respect to vinilidene fluoroplastics, the melting point is low and thus, the pin hole is not generated. This low molecular weight polytetrafluoroethylene naturally has bonding uniformity with high molecular weight polytetrafluoroethylene of high melting point. Further, since it is not etched even under plasma atmosphere, it can be used for a long term.

Further, since it is possible to adjust the thermal deformation temperature by adjusting the molecular weight as described above, even if a surface of a parent material of the static electricity chuck comprising vinilidene fluoroplastics is coated with polytetrafluoroethylene resin, the following performance with respect to bumps and dips surfaces of the substrate is high, the film thickness is uniformly thin and thus, the heat transfer performance is not affected. Therefore, high heat transfer performance can be obtained between the holding stage of the static electricity chuck and the work piece substrate. Further, the polytetrafluoroethylene is crystalline, so separation performance with respect to the substrate is excellent.

It is preferable that a mixture layer of vinilidene fluoride and the polytetrafluoroethylene is disposed between the insulating layer and the outermost polytetrafluoroethylene layer, and its mixing ratio is sequentially reduced from the inner layer toward the outer layer.

For example, a mixing amount of resin made of vinilidene fluoride as main component with respect to the polytetrafluoroethylene on the side of the vinilidene fluoride which is the insulating layer is increased to secure the adhesion with respect to the parent material, the mixing amount is stepwisely reduced toward the outermost layer on the absorbing side of the static electricity chuck, and the copolymer comprising vinilidene fluoride as main component is set to zero and the copolymer is made of 100% polytetrafluoroethylene on the outermost layer.

If copolymerization ratio is stepwisely reduced toward the outer layer between the vinilidene fluoride side which is the insulating layer and the polytetrafluoroethylene layer which is the outermost layer in this manner, the adhesion of the resin layer interposed between the insulating layer made of resin comprising vinilidene fluoride as main component and the outermost polytetrafluoroethylene resin layer is secured. At the same time, by adjusting the copolymerization ratio, the melting point can also be adjusted. Therefore, sufficient following performance with respect to bumps and dips of the substrate to be processed can be obtained, and it is possible to reduce the contact resistance and to enhance the heat transfer performance.

Further, it is preferable that molecular weight of the polytetrafluoroethylene resin layer is stepwisely increased from a surface of said insulating layer toward the absorbing surface. For example, the polytetrafluoroethylene on the side of the vinilidene fluoride which is the insulative parent material is set to low molecular weight so that adhesion with respect to resin comprising vinilidene fluoride as main component is secured, and at the same time, the molecular weight of the polytetrafluoroethylene is gradually increased toward the absorbing side, such that the melting point is adjusted to a desired value. By adjusting the melting point, it is possible to obtain a static electricity chuck surface having excellent following performance with respect to bumps and dips of the substrate to be processed.

The water dispersion type low molecular weight vinilidene fluoride has excellent adhesion with respect to the vinilidene fluoroplastics and its melting point is low. Therefore, pin holes are hardly generated as compared with the vinilidene fluoroplastics. The adhesion between polytetrafluoroethylene having different molecular weights is also excellent naturally and thus, the layers are not peeled off from each other. In addition, since the layer is not etched even under plasma atmosphere, the layer can be used for a long term.

In the present invention, it is preferable that the third electricity insulating layer having high insulation is directly disposed on an upper surface of the metal support plate of the static electricity chuck, and the viscous fluid layer or gel body layer is sealed by the insulating layer and the anti-corrosion second insulating layer disposed the surface of the insulating layer. With this, the shape-keeping characteristics of the viscous fluid layer is secured, or it is possible to compensate a poor insulative portion of the gel body by the insulating layer directly disposed on the support plate. As the high insulating layer disposed on the support plate, various polyimide resin and fluoroplastics are used as in the anti-corrosive insulating layer.

It is preferable that the electrode is directly disposed on a lower surface of the second insulating layer having corrosion resistance, or the electrode is directly disposed on the upper surface of the third insulating layer having high insulating properties, on the support plate. By disposing the electrode on such a position, formation of various insulating layers is facilitated. The electrode can be fixed via adhesive on the lower surface of the second insulating layer or on the upper surface of the high-insulative third insulating layer on the support plate, but the electrode can also be formed directly by vapor deposition or the like.

Further, when the electrode is directly disposed on the lower surface of the second insulating layer, since the electrode approaches the substrate disposed on the upper surface of the chuck, the static electricity absorbing force is increased. When the electrode is directly disposed on the upper surface of the high-insulative third insulating layer on the support plate, the electrode is stably fixed, and function as an electrode can stably be obtained.

Moreover, it is preferable that the second insulating layer coats the other insulating layer and the outside exposing surface of the metal support plate on the periphery of the insulating layer, and when the insulating layer coating the outside exposing surface of the metal support plate is directly fixed on the support plate through adhesive, plasma resistance and etching resistance with respect to the adhesive are enhanced, and a static electricity chuck apparatus having excellent heat resistance, chemical resistance, and aging resistance can be obtained.

If the insulating layer coating the outside exposing surface of the metal support plate is polytetrafluoroethylene resin, since polytetrafluoroethylene resin is not etched by ion or radical in the plasma atmosphere, it is preferably applied to a static electricity chuck apparatus of a semiconductor producing apparatus using plasma. To effectively apply this characteristics to the semiconductor producing apparatus, it is preferable to coat, with polytetrafluoroethylene, not only a surface exposed to plasma of the static electricity chuck, but also the support stage which supports and holds the static electricity chuck and a portion of the peripheral device which is exposed to plasma. By coating such portions with polytetrafluoroethylene, it is possible to enhance the durability of the peripheral device and to elongate the life of the entire apparatus.

BRIEF DESCRIPTION OF THE DRAWINGS

FIG. 2 is a sectional view schematically showing a structure of a static electricity chuck apparatus of a first embodiment of the present invention;

FIG. 3 is an explanatory view showing variation in shape of absorbing, holding and opening states of a semiconductor wafer at the time of plasma etching by the static electricity chuck apparatus of the present invention;

DESCRIPTION OF THE PREFERRED EMBODIMENTS

Hereinafter, preferred embodiments of the present invention are concretely explained with reference to the drawings.

Figure 1:
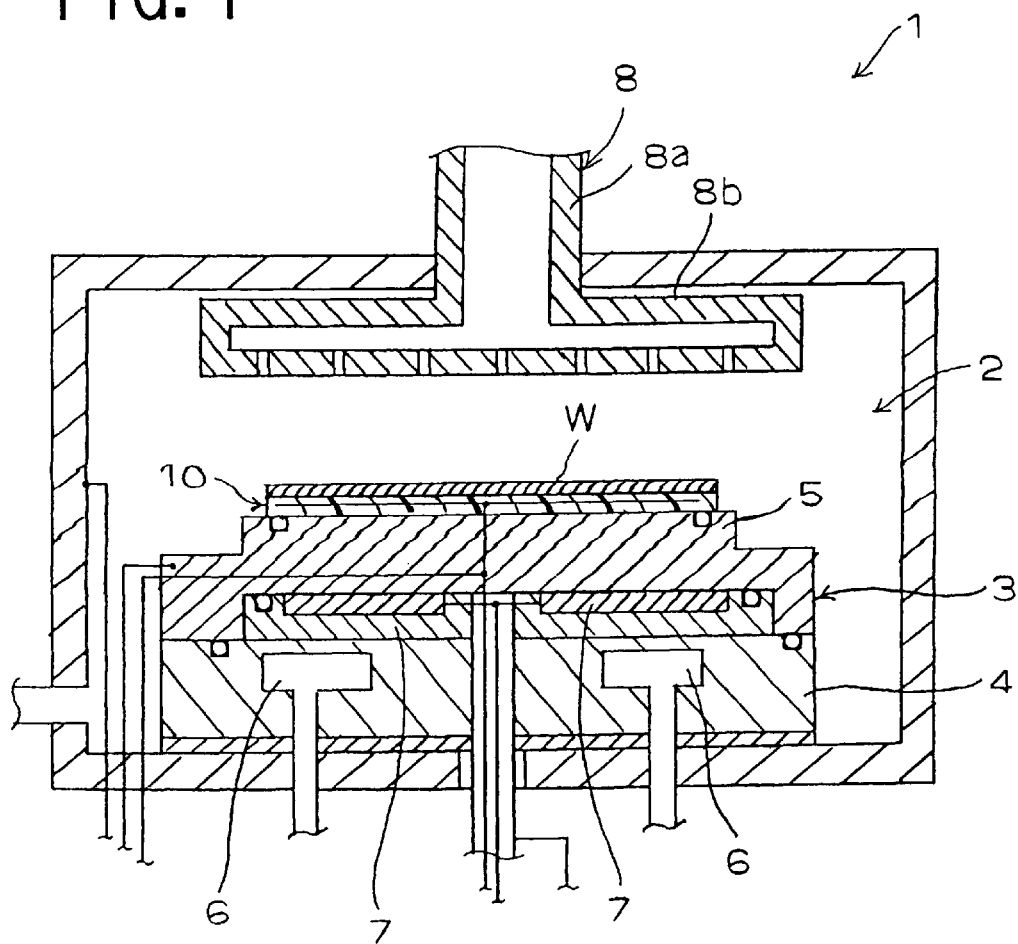
FIG. 1 is a schematic sectional view of a plasma etching apparatus having a static electricity chuck apparatus of the present invention.

FIG. 1 schematically shows a structure of a general plasma etching apparatus which is a kind of a semiconductor producing apparatus to which a static electricity chuck apparatus of the present invention is applied. Of course, the static electricity chuck apparatus of the present invention is applied not only to the plasma etching apparatus shown in the figure, but can also be applied to a semiconductor producing apparatus such as plasma CVD apparatus, plasma doping apparatus, ion beam etching apparatus, and ion plating apparatus.

In FIG. 1, a plasma etching apparatus 1 includes a processing chamber 2 which is formed hermetically by conductive material such as aluminum. An exhaust hole connected to an external exhaust source is formed on a peripheral portion near a bottom of the processing chamber 2. A chuck support stage 3 on which a semiconductor wafer W which is a work piece is disposed on a central portion of the processing chamber in a state in which the chuck support stage 3 is electrically insulating from a bottom of the processing chamber. The chuck support stage 3 fixes and holds the semiconductor wafer W.

The chuck support stage 3 comprises a base 4 and a susceptor 5 which is placed and fixed on an upper surface of the base 4. The base 4 is formed with a cooling jacket 6 for circulating refrigerant. A static electricity chuck apparatus 10 of the present invention is bonded and held on an upper surface of the susceptor 5 by adhesive. A temperature-adjusting heater 7 is interposed between the base 4 and the susceptor 5. The temperature-adjusting heater 7 adjusts the cooling amount by means of the cooling jacket 6, and maintains a constant temperature of the semiconductor wafer W. Refrigerant such as tiller is circulated in the cooling jacket 6, and the semiconductor wafer W is cooled by the circulating refrigerant through the susceptor 5 and the static electricity chuck apparatus 10.

The susceptor 5 functions as an electrode of high frequency power source to be applied when plasma is to be generated, and it is preferable to use aluminum or aluminum alloy, which has resistance against plasma gas and generates no dust. The electrode of conductive pattern embedded between the insulating layers of the static electricity chuck apparatus 10 functions as an electrode for absorbing wafer of the static electricity chuck apparatus, and examples of its material are metal conductor such as copper, aluminum and silver, and ceramic conductor such as titanium nitride.

A gas supply section 8 for etching gas is provided on an upper portion of the processing chamber 2. The gas supply section 8 includes a gas supply pipe 8a connected to an external processing gas source, and a hollow disk 8b which is in communication with a lower end of the gas supply pipe 8a and connected thereto. The hollow disk 8b is disposed so as to oppose to the semiconductor wafer W absorbed and held by the static electricity chuck apparatus 10, and a large number of small holes are formed in a lower surface of the hollow disk 8b so as to pass therethrough. Lead wires are connected to the static electricity chuck apparatus 10, the processing chamber 2, the susceptor 5, the temperature-adjusting heater 7 and the gas supply section 8, and the lead wires are connected to a power source (not shown) through a controller (not shown) wired outside the processing chamber.

In order to etch the semiconductor wafer W absorbed and held by the static electricity chuck apparatus 10 using the plasma etching apparatus 1, the processing chamber 2 is first evacuated to reduce the pressure in the chamber to 1 Pa to several tens of Pa. After the processing chamber 2 was depressurized, the semiconductor wafer W is mounted on the static electricity chuck apparatus 10, high DC voltage is applied, Coulomb force is applied and the semiconductor wafer W is absorbed. Then, processing gas is supplied into the processing chamber 2 through the gas supply section 8, high frequency electric power is applied between the gas supply section 8 and the susceptor 5, thereby generating plasma, and a surface of the semiconductor wafer W is etched.

As shown in FIG. 2, the static electricity chuck apparatus 10 of this embodiment is provided with first and second insulating layers 12, 13 above and below a conductive pattern electrode 11. As material of the first insulating layer 12 and second insulating layer 13, especially the second insulating layer 13, it is necessary that a solid is varied and semi-fluidized or fully fluidized in a range of 80 to 170° C., taking into consideration that a wafer temperature at the time of plasma etching is 100 to 160° C. In this embodiment, it is preferable that high polymer material is employed as material having physical properties as described above. Low density polyethylene (melting point: 105 to 115° C.), poly 1-butene (melting point: 120 to 128° C.), polypropylene (melting point: 150 to 170° C.), or resin comprising vinilidene fluoride as main component is used as the high polymer material. Material of the second insulating layer 13 is not limited to material which is reversibly changed between solid and liquid phase as described above, but includes material which maintains gel state such as silicon gel, polyurethane gel and epoxy gel as described after.

As high polymer material used for the first insulating layer 12, it is preferable that its melting point is 160° C. or higher, which is a temperature in the chamber at the time of plasma etching, and for example, it is possible to use thermosetting resin material such as heat conductive silicone rubber, or thermoplastic resin material having excellent insulating properties and heat resistance such as poly4-methylpentene-1 (melting point: 235 to 240° C.).

According to the embodiment, alumina filler and aluminum filler are mixed into the first insulating layer 12 and the second insulating layer 13. High polymer materials are generally inferior in heat conductivity and thus, if the fillers are mixed, heat conductivity can be increased remarkably, and heat radiation characteristics from absorbed body such as semiconductor wafer W under high temperature is largely improved.

Examples of adhesive 14 disposed between the first insulating layer 12 made of high polymer material disposed on the metal substrate are silicone rubber and acrylic adhesive. An example of adhesive 15 disposed among the first insulating layer 12, the conductive pattern electrode 11 and second insulating layer 13 is acrylic adhesive.

Further, in the embodiment, the entire surfaces of the first insulating layer 12, the conductive pattern electrode 11 and the second insulating layer 13 are coated with hardening film 16 of energy beam hardening mordant. As mentioned above, the energy beam hardening mordant comprises mixed compound of various acrylic mordant and energy beam polymer compound, and the material is selected based on compatibility with the first insulating layer 12, the second insulating layer 13 and adhesives 14 and 15. It is preferable that its film thickness is about 0.5 to 20 μm so as to secure the conformability with the semiconductor wafer which is absorbed body when the second insulating layer 13 is semi-fluidized or fluidized.

Next, etching processing by the plasma etching apparatus having the static electricity chuck of the embodiment consisting of foregoing features will be explained. Although it is not illustrated, the plasma etching apparatus generally includes upper and lower electrodes for generating plasma in the hermetic processing chamber, and an exhaust system for depressurizing the processing chamber. The processing chamber comprises a conductor such as aluminum whose inner wall surface is subjected to oxidized almite processing, and includes heating means for preventing reaction products generated by processing gas and plasma from adhering on the inner wall surface.

In the embodiment, the upper electrode is the conductive pattern electrode 11 disposed between the first insulating layer 12 and the second insulating layer 13, and the lower electrode is the metal support stage 3 which supports the static electricity chuck apparatus 10. The conductive pattern electrode 11 is electrically grounded, the metal support stage 3 is formed of aluminum, and connected to a high frequency power source (not shown). A cooling passage 17 for controlling a temperature of the semiconductor wafer which is the absorbed body through an insulator (not shown) is provided inside the metal support stage 3, and galden, for example, is introduced into the cooling passage 17.

According to the static electricity chuck apparatus 10 of this embodiment, when the semiconductor wafer is placed on the absorbing surface of the second insulating layer 13, high voltage is supplied to the conductive pattern electrode 11, so that opposite electric charges are charged to the surfaces of the semiconductor wafer and the second insulating layer 13, and static absorbing force is generated by this charge, and the semiconductor wafer is absorbed and held by the absorbing surface of the static electricity chuck apparatus 10. Next, processing gas is introduced into the processing chamber, pressure in the processing chamber is maintained at a set value, processing electricity of 500 to 2 KW is applied by a high frequency power source (not shown), thereby generating plasma between the conductive pattern electrode 11 and the semiconductor wafer, and the semiconductor wafer is etched by the plasma.

At the time point when the semiconductor wafer W is absorbed by the absorbing surface of the static electricity chuck apparatus 10 as described above, a large number of fine gaps are generated between the absorbing surface of the static electricity chuck apparatus 10 and the semiconductor wafer W which is the absorbed body as shown in FIG. 3(a). In this state, when the plasma is generated and the semiconductor wafer W is processed, the temperature is increased by the generated heat amount at the time of generation of plasma, the second insulating layer 13 is changed from solid phase to softened or fluidized state and changed into liquid phase, and the absorbing surface of the second insulating layer 13 fits onto and is brought into intimate contact with the bumps and dips of the lower surface of the semiconductor wafer W.

When the etching process is completed, and electricity applied from the high frequency power source is cut off and plasma is no longer generated, no heat enters the semiconductor wafer W, a temperature of the static electricity chuck apparatus 10 is lowered. By this temperature reduction, the second insulating layer 13 is solidified, and semiconductor wafer W is held in a state shown in FIG. 3(c). At that time, in this embodiment, since the absorbing surface of the second insulating layer 13 is coated with the hardening film 16, the hardening film 16 and the second insulating layer 13 are not adhered to each other, and adhesion force does not work between the hardening film 16 and the semiconductor wafer W, and the semiconductor wafer W can easily be peeled off from the absorbing surface and transferred as shown in FIG. 3(d).

Figure 4:
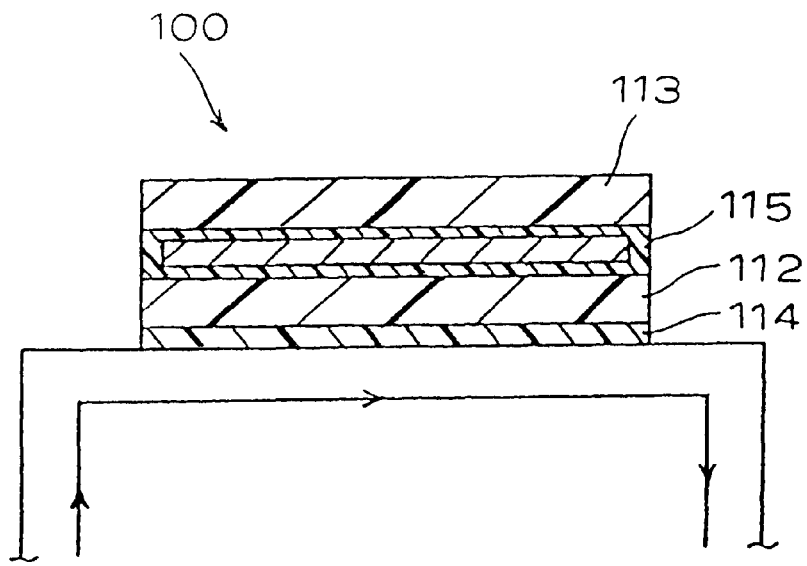
FIG. 4 is a sectional view schematically showing a structure of a static electricity chuck apparatus of a second embodiment of the present invention.

FIG. 4 schematically shows a static electricity chuck apparatus 100 according to another embodiment of the present invention. In this embodiment, the outer exposing surfaces of a first insulating layer 112, a second insulating layer 113 and adhesives 114 and 115 are not coated with the hardening film as in the former embodiment. In this case, all of the first insulating layer 112, the second insulating layer 113 and the adhesives 114 and 115 have excellent corrosion resistance, and high polymer material having physical properties not to be fluidized and maintains the softened state even under high temperature in the processing chamber is used for the second insulating layer 113.

Such materials as fluoroplastics or fluorine rubber can be used as the high polymer material. They have excellent heat resistance and corrosion resistance, and since they have poor adhesion, it is easy to peel off the absorbed body from the absorbing surface after processing. There are many kinds of fluoroplastics, such as PTFE, PFA, FEP, EPE, ETFE, PCTFE, ECTFE, PVDF and PVF, and since their melting points are dispersed over wide range from 170° C. to 327° C., it is possible to select an appropriate material in accordance with the processing temperature of the absorbed body, material which is not melted under various processing temperatures and which can absorb and hold the absorbed body in semi-fluidized state (gel state) may be selected.

As described above, according to the static electricity chuck of the present invention, the second insulating layer 13, 113 constituting the absorbing surface is semi-fluidized or fluidized in accordance with a temperature in the processing chamber, and it is absorbed and held in intimate contact with fine bumps and dips existing on the absorbing surface of the absorbing body without gaps. When it is coated with the hardening film 16 or not coated and the shape of the second insulating layer 13, 113 is not held as in the second embodiment, in order to hold a peripheral surface of the second insulating layer 13, 113, ceramic frame can be provided for example. As a result, it is possible to effectively suppress the increase in contact thermal resistance in vacuum, and the conventional need of gas supply equipment such as He gas for promoting the heat transfer is eliminated.

Since the contact thermal resistance can be reduced as described above, it is possible to set a temperature of the absorbed body itself to a lower value, or cooling force of the absorbed body can be reduced, compared to the conventional technique. Further, since the second insulating layer 13, 113 is softened or fluidized, even if such an absorbing object as the semiconductor wafer is frequently replaced, since the absorbing surface of the second insulating layer 13, 113 conforms the shape of the absorbing surface of the semiconductor wafer, it is possible to suppress the contact thermal resistance with respect to all replaced wafers to minimum level. In the above embodiment, since all the exposing surfaces of the first insulating layer 12, the second insulating layer 13 and the adhesives 14 and 15 are coated with the hardening film 16, they are not directly exposed to peripheral atmosphere in the processing chamber and thus, deficiency such as corrosion or deterioration is not generated.

Figure 5:
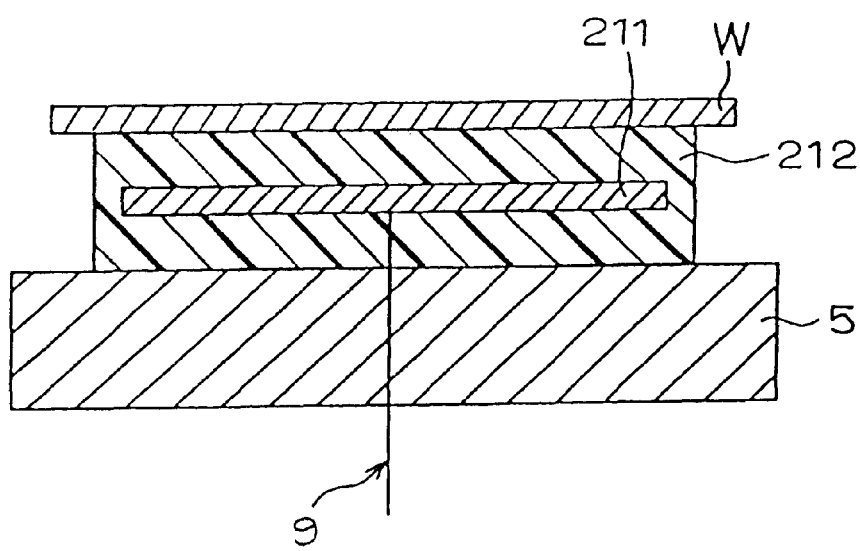
FIG. 5 is a schematic view showing a structure of a static electricity chuck apparatus of a third embodiment of the present invention.

In FIG. 5, a gel body having low hardness is employed as an insulating layer 212 for coating an electrode 211. This figure shows a third embodiment in which a gel high polymer material is singly used as the insulating layer 212. The electrode 211 is completely coated with the insulating layer 212 comprising the gel high polymer material.

Figure 7:
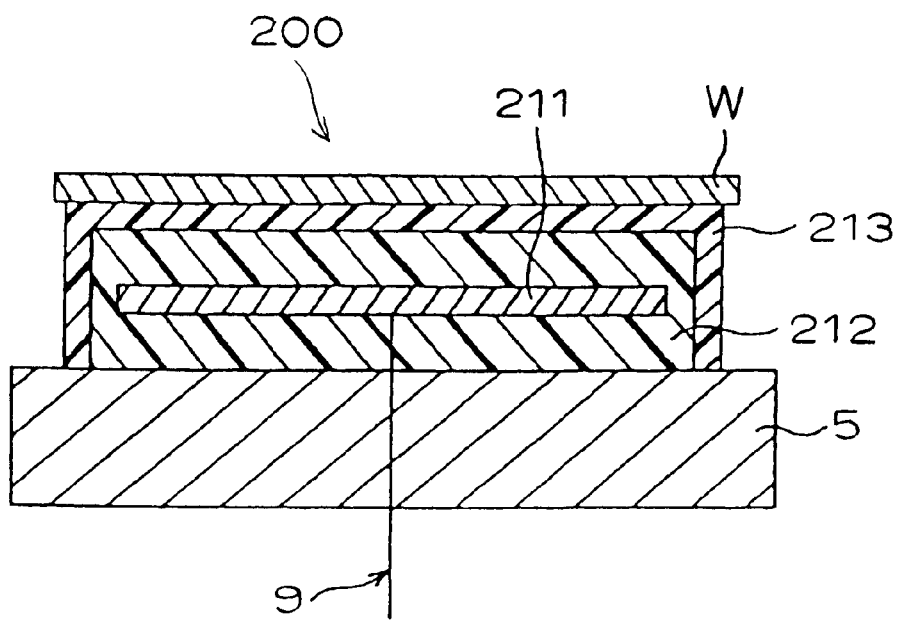
FIG. 7 is a schematic view showing a structure of a static electricity chuck apparatus of fourth and fifth embodiments of the present invention.

In the present invention, as shown in FIG. 7, an exposing surface of the first insulating layer 212 is coated with a second insulating layer 213 comprising corrosion resistance insulating layer such as polyimide resin. In the following third to eighth embodiments, a static electricity chuck apparatus 200 of the present invention is bonded on a cooling susceptor (metal support plate) 5 through adhesive or the like for example.

Further, as shown in FIGS. 10 and 12 to 15, a third insulating layer 214 can be disposed between the metal support plate 5 and the electrode 211. As the third insulating layer 214, a resin having heat resistance and high insulating properties such as various polyimide resin, PEEK (polyether ether ketone), PBI (polybenzimidazole) or PPS (polyphenylene sulfide) is used.

In this case, the electrode 211 is bonded to an upper surface of the third insulating layer 214 or a back surface of the anti-corrosive insulating layer 213 through adhesive, or directly formed by vapor deposition or the like. When the first insulating layer 212 is completely coated with the second and third insulating layers 213 and 214, viscous fluid having insulative and heat conductive properties such as various greases and oil can be used as material of the first insulating layer 212.

(Third Embodiment)

FIG. 5 shows a third embodiment of the present invention. In the plasma etching processing, for example, the static electricity chuck apparatus 200 is mounted on the susceptor 5. The static electricity chuck apparatus 200 comprises an electrode 211 and an insulating layer 212 which is a gel high polymer material of low hardness covering the entire surface of the electrode 211. DC voltage is applied to the electrode 211 between the substrate-holding surface of the static electricity chuck apparatus 200 and the wafer W through a lead wire 9, absorbing force called Coulomb force by dielectric polarization or Johnson-Rahbeck force by infinitesimal leakage current is generated to absorb and hold the wafer W on the holding surface. Normally, an electric wire coated with fluoroplastics having excellent insulating and pressure resistance properties such as PTFE, FEP or PFA is used as the lead wire 9.

In the present invention, the hardness of the insulating layer 212 made of a gel high polymer material is "low hardness," and, as described above, it is preferable that the JIS K6301 hardness is 10 or lower and the penetration number of JIS K2207 is 5 or higher and especially 50 to 200. Since the insulating layer 212 has low hardness and low elastic modulus, the holding surface of the static electricity chuck apparatus 10 deforms and conforms to the shape of the lower surface of the wafer W, and comes into intimate contact at substantially entire surface, and contact thermal resistance of the insulating layer 212 with respect to the wafer W can be reduced.

If the thickness of the insulating layer 212 made of gel high polymer material is too thin, the mechanical strength and breakdown voltage are deteriorated, which is not always effective for reducing the contact thermal resistance. On the other hand, if the thickness is too thick, the thermal resistance is increased corresponding to the thickness and as a result, thermal resistance of the insulating layer 212 itself is also increased. That is, there is a certain range of an optimal value of the thickness of the insulating layer 212 made of a gel high polymer material, and it is 0.1 to 2 mm. Especially when it is used as the static electricity chuck apparatus 10, since its absorbing force is inversely proportional to square of the thickness of the dielectric layer, it is further preferable that the thickness is 1 mm or less. It is preferable that thermal conductivity of the insulating layer 212 is 1 W/m·K or higher, and insulative and heat conductive filler such as alumina, aluminum nitride, boron nitride, or silicon nitride may be added.

Examples of a gel high polymer material which is a constituent material of the insulating layer 212 are silicon gel, polyurethane gel and epoxy gel, and silicon gel is most effective because it has excellent characteristics as shown below. In this embodiment, silicon gel is employed as the gel high polymer material.

A basic structure of the silicon gel is a material obtained by crosslinking the dimethyl siloxane polymer, the material is much softer than rubber and has intermediate nature between silicon rubber and silicon oil, and has shape-keeping characteristics. Especially, its crosslink density is controlled to a level as low as ⅓ to ⅒ of the silicone rubber. The polymer-skeleton of this silicon gel is thermally stable, the gel state can be maintained over a wide temperature range, and as described above, the silicon gel has excellent features: 1) temperature dependency of physical properties is small and there is heat resistance, 2) mechanical strength is relatively high, 3) viscoelasticity characteristics can be adjusted and it is easy to form the silicon gel, and 4) electrical characteristics and weather resistance are excellent.

Next, in a vacuum chamber which can be depressurized to 1 Pa, for each of a case in which an aluminum plate and a heater are directly mounted on a cooling aluminum plate sequentially, and a case in which various electricity insulating layers are mounted to a cooling aluminum plate and an aluminum plate and a heater are sequentially mounted thereon, in a state in which pressure of 100 gf/cm$^2$ was applied to each case, the upper heater was heated, and a difference between a temperature of the aluminum plate and a temperature of a doorway of cooling liquid which cooled the aluminum plate when the temperature of the aluminum plate was equilibrated was measured, and the contact thermal resistance between the aluminum plate and the insulating layer was calculated from the measured value, and the cooling performance was confirmed.

Figure 6:
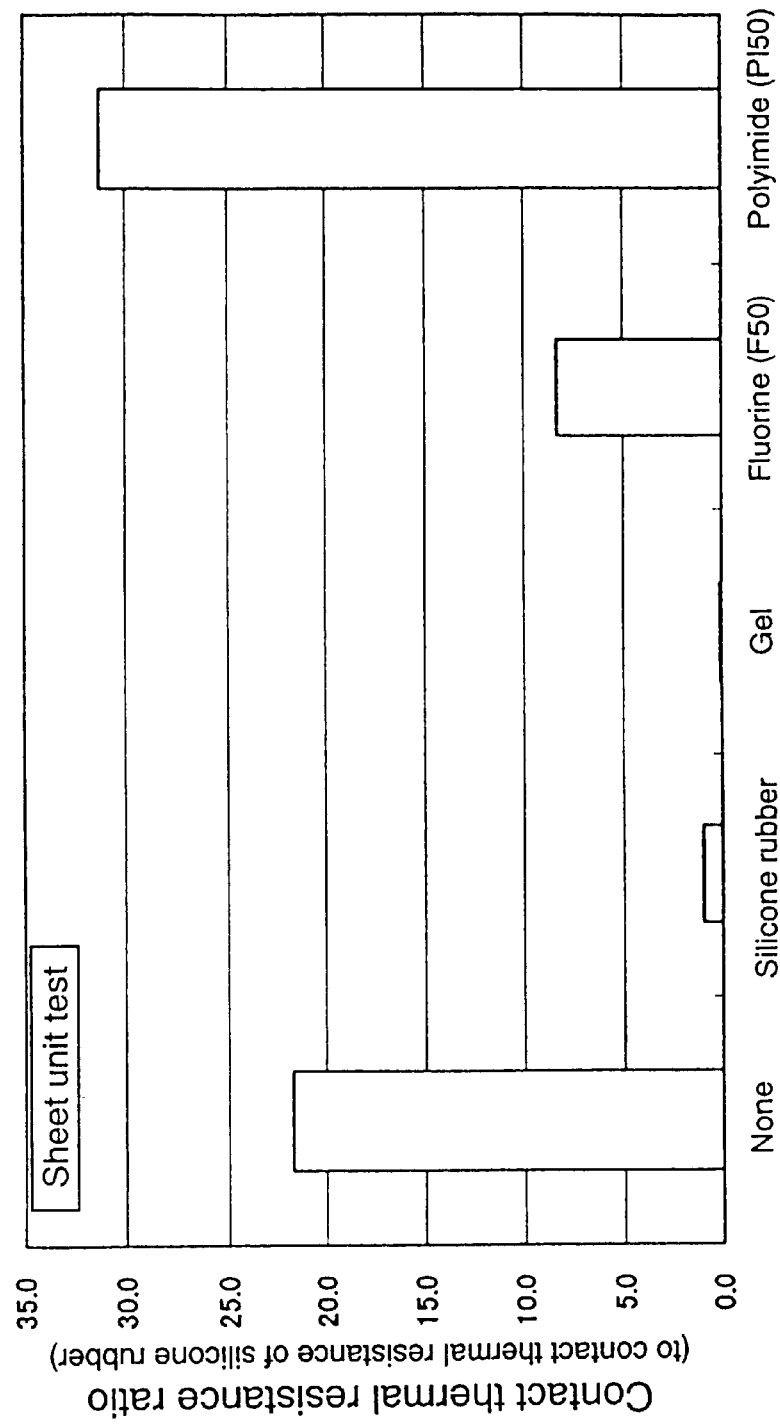
FIG. 6 shows experimental results of an electric insulating layer in the static electricity chuck apparatus of the third embodiment and contact heat resistance of other electric insulating layers.

FIG. 6 shows the experimental results. A value of the contact thermal resistance ratio shown in this figure is a value in which the contact thermal resistance value of the silicone rubber is set to 1 as a reference.

As understood from the figure, when the electricity insulating layer is not inserted, the contact thermal resistance is extremely large under vacuum (1 Pa), but if the silicon gel or silicone rubber of the present invention which has low hardness and low elastic modulus is inserted, it can be understood that the contact thermal resistance under vacuum is largely improved. Especially, silicon gel having the above-mentioned hardness of the present invention is most effective. A slight improvement can be found even when PTFE (F50) resin having relatively low hardness is inserted as the electricity insulating layer, but even if polyimide which has high hardness and high elastic modulus is inserted, it is found that the contact thermal resistance is increased on the contrary, and the contact thermal resistance becomes higher than that when the insulating layer is not inserted.

(Fourth Embodiment)

FIG. 7 shows a schematic structure of a static electricity chuck apparatus 200 according to a fourth embodiment of the present invention. The static electricity chuck apparatus 200 is bonded on a susceptor 5 through adhesive. Like the previous embodiment, an electrode 211 of the static electricity chuck apparatus 200 is coated with a first insulating layer 212 comprising low-hardness silicon gel, and an exposing surface of the insulating layer 212 is coated with a second insulating layer 213 comprising anti-corrosive protecting film.

Examples of material of the anti-corrosive layer 213 used in this embodiment are polyimide resin or fluoroplastics, and examples of the polyimide resin are not only aromatic polyimide (PI) which is a condensation reaction type and non-thermoplastic, but also thermoplastic polyimide, or polyether imide (PEI) or polyamide imide (PAI) which is additive reaction type thermosetting polyimide.

Examples of fluoroplastics are PTFE, PFA, ETFE and FEP, and especially, PTFE and PFA, which are chemically stable, are preferable. In this embodiment, three layer structure may be employed in which, for example, silicon gel is coated with PFA and then coated with PTFE, or silicon gel is coated with PTFE and then with polyimide. That is, in the present invention, as long as anti-corrosive protecting film is disposed on the outermost layer, a multi-layer structure in which various insulating layers are freely combined between the gel high polymer material and the outermost layer may be employed.

The film thickness of the anti-corrosive protecting film is preferably thin in view of the contact thermal resistance, but if it is too thin, the film cannot exhibit a function as a protecting film and mechanical strength is also lowered. As apparent from the experimental result described after, when low hardness gel high polymer material is used for the first insulating layer 212 as in the static electricity chuck apparatus 200 of this embodiment, sufficient cooling characteristics can be obtained even if anti-corrosive protecting film of 50 μm is used. Therefore, it is preferable that the film thickness of the anti-corrosive protecting film which is the second insulating layer 213 in the static electricity chuck apparatus 200 of this embodiment is 10 to 50 μm.

Next, like the third embodiment, in a vacuum chamber which can be depressurized to 1 Pa, various electricity insulating layers are mounted to a cooling aluminum plate and an aluminum plate and a heater are sequentially mounted thereon, in a state in which pressure of 100 gf/cm$^2$ was applied, the upper heater was heated, and a difference between a temperature of the aluminum plate and a temperature of a doorway of cooling liquid which cooled the aluminum plate when the temperature of the aluminum plate was equilibrated was measured, and the contact thermal resistance between the aluminum plate and the insulating layer was calculated from the measured value, and the cooling performance was confirmed.

Figure 8:
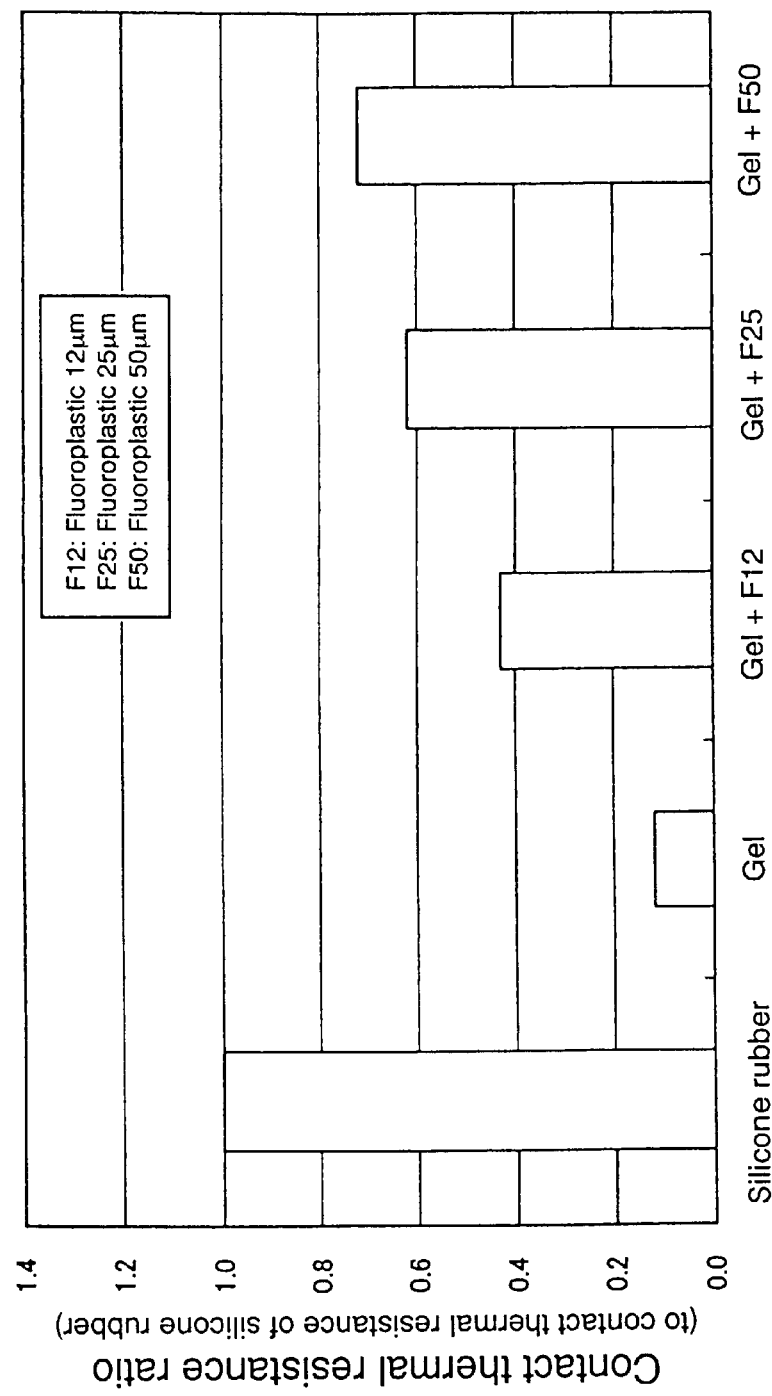
FIG. 8 shows a comparison showing experimental results of contact heat resistance of the electric insulating layer and other electric insulating layers in the static electricity chuck apparatus of the third embodiment.

FIG. 8 shows the experimental results in which contact thermal resistance was measured for silicone rubber of 300 μM thickness, silicon gel of 300 μm thickness, and silicon gels of 300 μm thickness on which three kinds of fluoroplastics, which are anti-corrosive protecting films, of 12, 25, and 50-μm thickness are laminated respectively. In this figure, contact thermal resistance of each sample is relative contact thermal resistance value when that of silicone rubber is defined as 1.

When fluoroplastics is laminated on silicon gel, the contact thermal resistance is increased compared to that of gel alone, but it can be understood that the contact thermal resistance is lower than that of the silicone rubber alone even if the fluoroplastics of 50-μm thickness is laminated. That is, when gel high polymer material of low hardness having penetration number of around 50 is used as the first insulating layer 212, it can be found that even if a sheet of about 50 μm thickness is laminated as the anti-corrosive protecting film and sufficient plasma resistance is given, the cooling characteristics are more excellent than that of the conventional static electricity chuck made of silicone rubber.

(Fifth Embodiment)

A structure of a static electricity chuck of a fifth embodiment is similar to that of the fourth embodiment shown in FIG. 7. An electrode 211 of a static electricity chuck apparatus 200 is coated with a first insulating layer 212 comprising low hardness silicon gel, and an exposing surface of the insulating layer 212 is coated with a second insulating layer 213 comprising anti-corrosive protecting film. The fifth embodiment is different from the second embodiment in that as a material of the second insulating layer 213, which is the anti-corrosive protecting film, polyimide resin is used instead of fluoroplastics.

Figure 9:
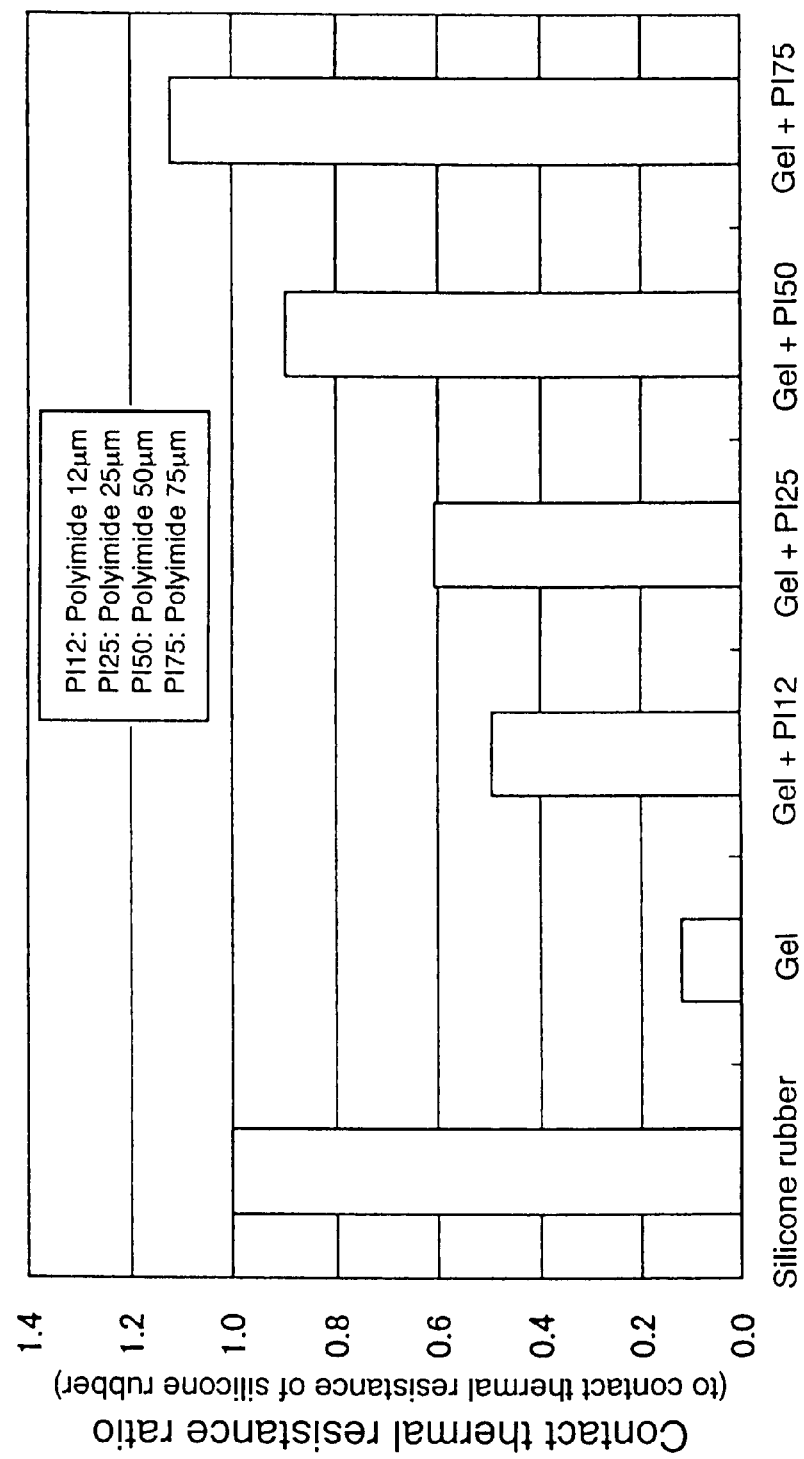
FIG. 9 shows a comparison showing experimental results of contact heat resistance of the electric insulating layer and other electric insulating layers in the static electricity chuck apparatus of the fourth embodiment.

FIG. 9 shows the experimental results in which contact thermal resistance was measured, as in the foregoing second embodiment, wherein silicone rubber of 300 µm thickness, silicon gel of 300 µm thickness, and silicon gels of 300 µm thickness to which four kinds of polyimide resin layers of 12, 25, 50, and 75-µm thickness are laminated respectively, are inserted as sheet material inserted between the aluminum plates. In this figure, too, contact thermal resistance of each sample is relative contact thermal resistance value when that of the silicone rubber is defined as 1.

As understood from this figure, when compared to the second embodiment, even if the first insulating layer 23 comprising silicon gel is coated with the second insulating layer 24 comprising polyimide resin as anti-corrosive protecting film, its contact thermal resistance is the same as that of the fourth embodiment until the film thickness of the second insulating layer 24 is 50 µm. However, if the thickness exceeds 50 µm, the contact thermal resistance becomes larger than that of the static electricity chuck made of silicone rubber.

In this manner, it was demonstrated that even if anti-corrosive protecting film made of polyimide which has elastic modulus of several GPa and relatively high hardness was used, the intended function of the present invention could sufficiently be achieved. From the experiment results, it was confirmed that the static electricity chuck apparatus 200 of each of the second and third embodiments is a high performance static electricity chuck having excellent cooling characteristics and plasma resistance (durability).

(Sixth and Seventh Embodiments)

Figure 10:
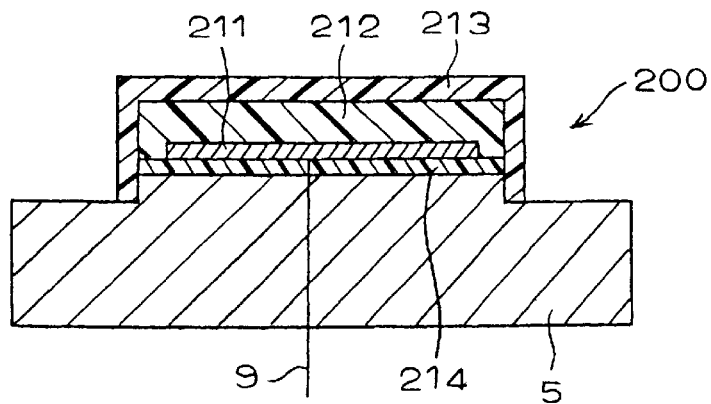
FIG. 10 is a schematic view showing a structure of a static electricity chuck apparatus of a sixth embodiment of the present invention.
Figure 11:
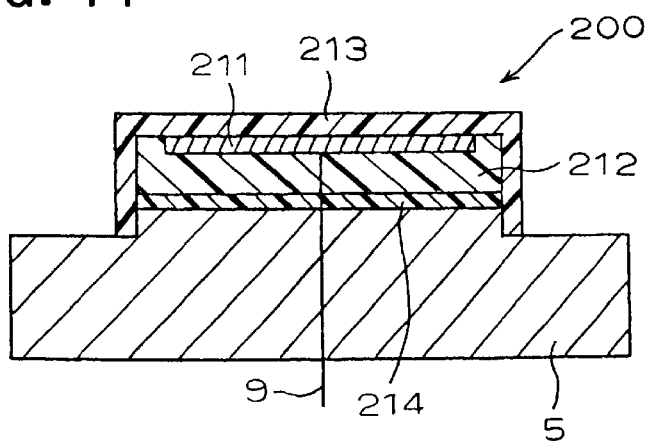
FIG. 11 is a schematic view showing a structure of a static electricity chuck apparatus of a seventh embodiment of the present invention.

FIGS. 10 and 11 show sixth and seventh embodiments of the present invention.

According to the sixth embodiment, a third insulating layer 214 having high insulating properties is directly bonded on a support surface of a susceptor 5 through adhesive, and then, an electrode 211 is fixed on its upper surface by bonding or vapor deposition. In addition, a first insulating layer 212 of gel high polymer material, which is formed of the same material as that of the fourth embodiment, and is molded in advance or is directly molded, is fixed so as to coat an upper surface and peripheral surface of the electrode 211. Lastly, all of the outer exposing surfaces of the first insulating layer 212 and the third insulating layer 214 are coated with second insulating layer 213 made of the same material as that of the fourth embodiment. In this embodiment, since it is only necessary to simply fix the electrode 211 on the upper surface of the third insulating layer 214, it is easy to produce the static electricity chuck apparatus 200, and moreover, fixing position of the electrode 211 is immovable. Thus, as compared with the third and fourth embodiments, it is possible to uniform the distances between the electrode 211 and the wafer W disposed on the static electricity chuck apparatus 200 and therefore, more stable absorption by the static electricity chuck apparatus 200 is done.

In the seventh embodiment, like the sixth embodiment, a third insulating layer 214 having high insulating properties is directly adhered to a support surface of a susceptor 5 by adhesive. A first insulating layer 212 of gel high polymer material, which is made of the same material as that of the third embodiment, and is molded in advance or is directly molded, is fixed to an upper surface of the third insulating layer 214. Further, an electrode 211 is fixed to an upper surface of the first insulating layer 212, and all of outer exposing surfaces of the electrode 211, the first insulating layer 212 and the third insulating layer 214 are coated with the second insulating layer 213 as in the sixth embodiment.

In this embodiment, the fixing position of the electrode 211 is immovable, stable absorption by the static electricity chuck apparatus 200 is realized as in the sixth embodiment. Moreover, since a distance between the electrode 211 and the wafer W placed on a predetermined surface of the static electricity chuck apparatus 200 is shortened compared to that in the sixth embodiment, static electricity absorbing force is increased.

Further, in these embodiments, since the third insulating layer 214 having high insulating properties is interposed between the first insulating layer 212 having poor insulating properties and the susceptor 5, high insulating properties required as the static electricity chuck is obtained, and strong absorbing performance can be exhibited. In the foregoing sixth and seventh embodiments, a periphery of the support surface of the static electricity chuck of the susceptor 5 is formed low with a step, and not only the outer exposing surfaces of the first insulating layer 212 and the third insulating layer 214, but also the entire side peripheral surface of the step of the susceptor 5 are coated with the second insulating layer 213. As a result, corrosion resistance of the adhesive layer interposed between fixing surface of the susceptor 5 and the third insulating layer 214, and corrosion resistance of the side peripheral surface of the step of the susceptor 5 are also enhanced.

FIGS. 12 to 15 show modifications of the sixth embodiment.

Figure 12:
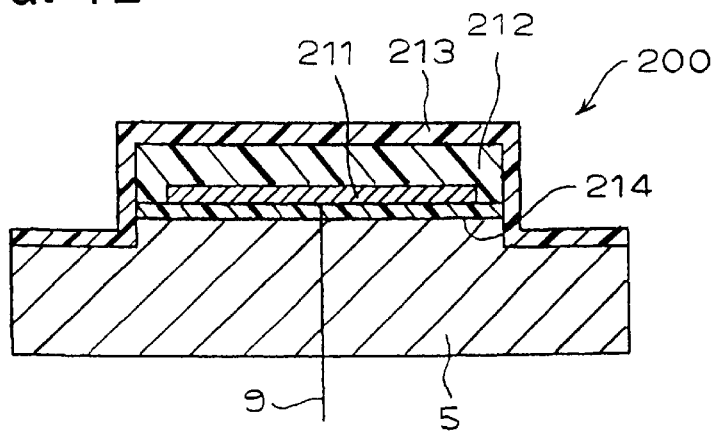
FIG. 12 is a schematic view showing a structure of a static electricity chuck apparatus of a modification of the sixth embodiment.
Figure 13:
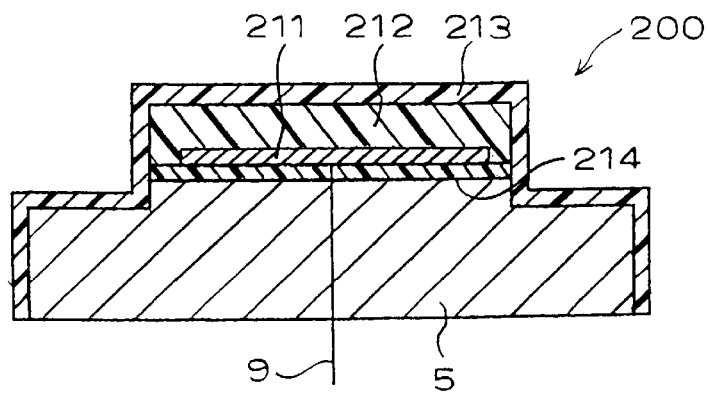
FIG. 13 is a schematic view showing a structure of a static electricity chuck apparatus of another modification of the sixth embodiment.
Figure 14:
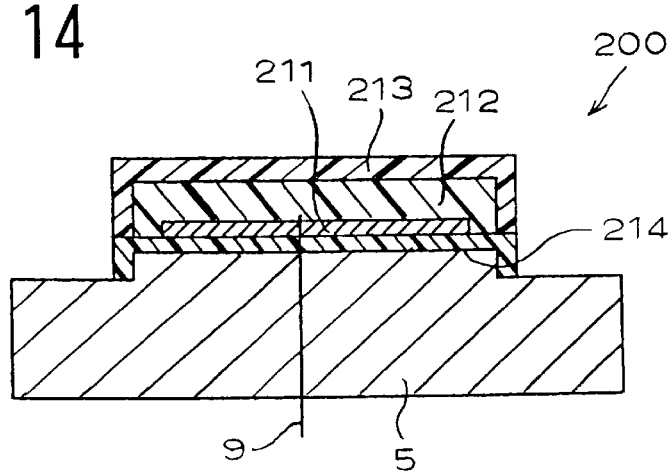
FIG. 14 is a schematic view showing a structure of a static electricity chuck apparatus of another modification of the sixth embodiment.
Figure 15:
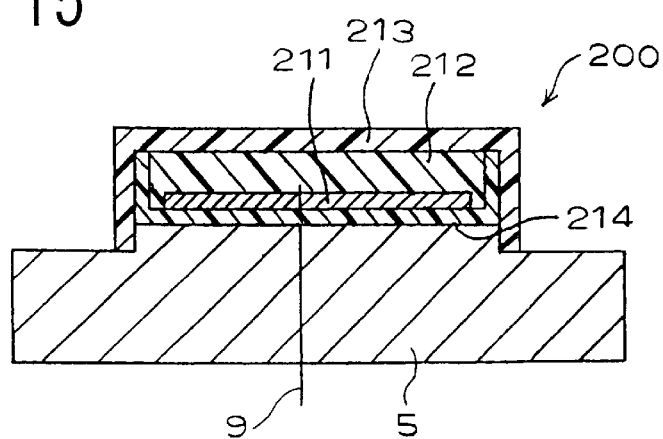
FIG. 15 is a schematic view showing a structure of a static electricity chuck apparatus of another modification of the sixth embodiment.

In the modification shown in FIGS. 12 and 13, not only the side peripheral surface of a step of the susceptor 5, but also an upper surface portion continuous with the step or the said upper surface portion and all peripheral side surface of the susceptor 5 are coated with the second insulating layer 213, thereby securing plasma resistance and etching resistance of the susceptor 5. In the modification shown in FIG. 14, the step side peripheral surface of the susceptor 5 is coated with a third insulating layer 214 fixed to an upper surface of the susceptor 5, instead of the second insulating layer 213. In this case, a material having excellent corrosion resistance is naturally used as the third insulating layer 214 like the second insulating layer 213. In the modification shown in FIG. 15, the whole peripheral surface of the first insulating layer 212, which is an insulative viscous fluid layer or gel insulating layer, is coated with the third insulating layer 214. Moreover, the upper surface of the first insulating layer 212, the outer exposing surface of the third insulating layer 214, and the step side peripheral surface of the susceptor 5 are coated with the second insulating layer 213. In this case, all the peripheral surface of the first insulating layer 212 comprising gel material or viscous fluid having flexibility and flowability is coated with two layers, i.e., the second and third insulating layers 213 and 214. Thus, sufficient strength is obtained and durability is enhanced, too.

As apparent from the above explanation, since the basic structure of the static electricity chuck of the present invention comprises at least insulative viscous fluid or low hardness gel high polymer material, adhesion between the back surface of the substrate and the holding surface of the static electricity chuck is enhanced. As a result, contact thermal resistance is reduced, and it is possible to obtain a static electricity chuck with high performance and durability having excellent cooling performance which can precisely control a temperature of a surface of the wafer without using the conventional technique of flowing cooling gas for facilitating heat transfer between the back surface of the substrate and the static electricity chuck.

Further, in the present invention, the exposing surface of the all insulating layers including electricity insulating layer comprising the viscous fluid or low hardness gel high polymer material may be coated with anti-corrosive protecting film such as fluoroplastics and polyimide resin. In this case, by appropriately selecting hardness and resilience of the electricity insulating layer comprising the gel high polymer material, and film thickness of the anti-corrosive protecting film, it is possible to enhance the plasma resistance and the durability without deteriorating the cooling characteristics of the substrate.

When an insulating layer having normal high insulating properties is interposed between a support plate, on which the static electricity chuck is placed and fixed, and a viscous fluid or gel material, which has poor insulating properties, it is possible to secure insulating performance required for the static electricity chuck and to realize strong absorption. Further, when the second insulating layer comprising a corrosion resistance insulating layer coating the outer exposing surface of the static electricity chuck is coated with a metal support plate surface of static electricity chuck periphery, it is possible to enhance the corrosion resistance with respect to the adhesive layer existing between the support plate surface and the third insulating layer, and the peripheral support plate surface.

Figure 16:
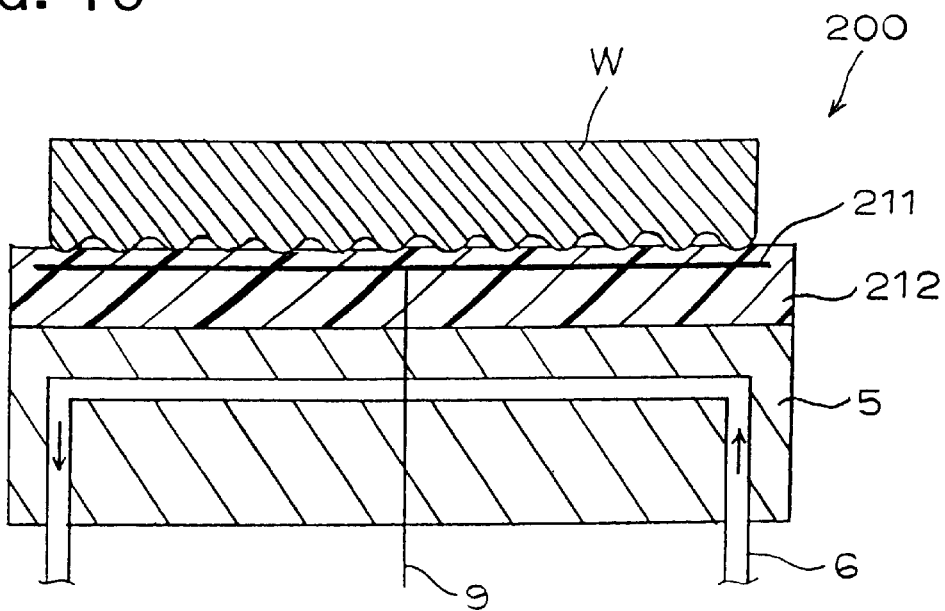
FIG. 16 is a schematic view showing a structure of a static electricity chuck apparatus of a seventh embodiment of the present invention.

FIG. 16 shows a schematic structure when a wafer is absorbed by a static electricity chuck apparatus of the seventh embodiment of the present invention. In this figure, contact surface between the semiconductor wafer W and the static electricity chuck apparatus 200 and peripheral equipment are schematically shown for better understanding.

A static electricity chuck apparatus 200 of this embodiment also includes the same basic structure as that of the sixth embodiment, and is provided at its central portion with a thin electrode 211, and a resin material having vinylidene fluoride as main component is coated with an insulating layer 212 which is insulative parent material.

This static electricity chuck apparatus 200 is adhered and fixed to a chuck support stage 3 of the susceptor through silicon adhesive or polyimide adhesive. High DC voltage is applied to the thin electrode 211 through a lead wire 9. As described above, the cooling jacket 6 is disposed in a base of the chuck support stage 3, and refrigerant is circulated through the jacket.

Aluminum is used also for the electrode 211 of the static electricity chuck apparatus 200 of this embodiment. The surface of this aluminum electrode is subjected to almite processing, thereby improving the adhesion with respect to the resin material comprising vinilidene fluoride as main component. As resin material comprising the vinilidene fluoride as the main component, copolymer of vinilidene fluoride ethylene trifluoride (G150F200 produced by Central Glass Co. Ltd.) was used.

The copolymer of vinilidene fluoride ethylene trifluoride is soluble to N-methyl-2-pyrrolidone (simply NMP, hereinafter), and unlike the normal vinilidene fluoride, dielectric constant is generated even with non-rolling. This solution was applied to a surface of the aluminum electrode by spin application, and the insulative parent material 212, which is the first insulating layer, was formed. Since the insulative parent material 212 can easily be formed in this manner, it is easy to make the film thin, but the obtained dielectric constant is 5, which is lower than 7.5 of normal vinilidene fluoride, but since sufficient thin film is obtained unlike a drawn film and the like, actual dielectric force can be increased.

In this embodiment, copolymer (G150F200) of 15 weight % of vinilidene fluoride ethylene trifluoride was dissolved in NMP 85 weight % to make uniform solution. This solution was applied to aluminum electrode which was subjected to almite processing, the electrode was dried for 20 hours at 100° C., thereby the insulative parent material 212 a comprising coated body having film thickness of 40 μm and entire thickness of 80 μm was formed.

The static electricity chuck apparatus 200 having copolymer of vinilidene fluoride ethylene trifluoride as the insulative parent material obtained in this manner has smaller surface hardness, and higher following performance with respect to bumps and dips of semiconductor wafer W than those of the conventional insulative parent material comprising polyimide resin or ceramic. Therefore, the contact thermal resistance becomes small and heat transfer performance is enhanced. The insulative parent material of this embodiment has poor cohesiveness as compared with silicone rubber and thus, the adhesion force is not increased by long-term repeatedly stress, and separation performance of the semiconductor wafer with respect to the static electricity chuck surface is secured.

Figure 17:
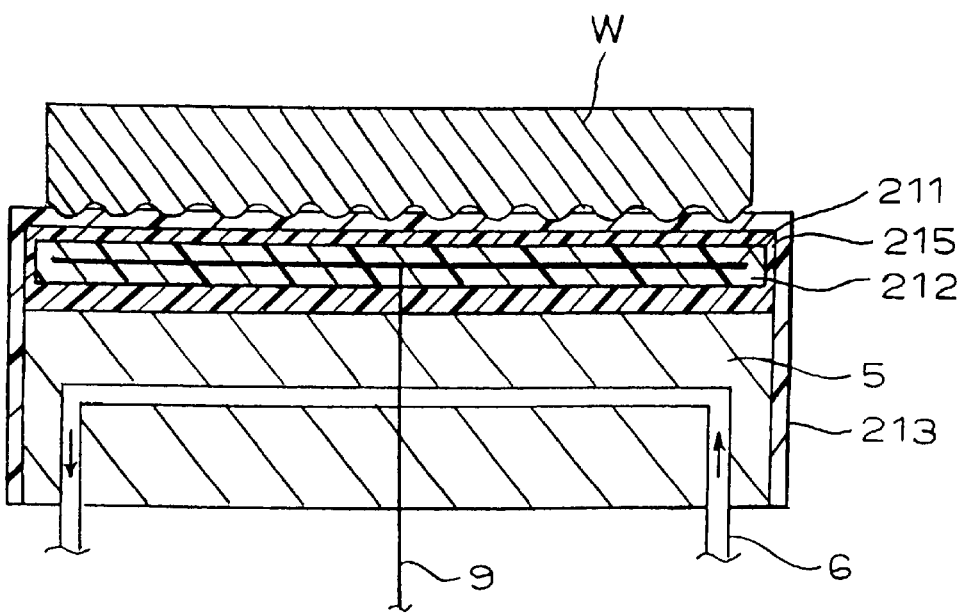
FIG. 17 is a schematic view showing a structure of a static electricity chuck apparatus of an eighth embodiment of the present invention.

FIG. 17 schematically shows a static electricity chuck apparatus of an eighth embodiment of the invention. This apparatus is different from that of the seventh embodiment in that the entire surface, which exposes inside of a processing chamber 2, of the insulating layer 212 made of resin material comprising vinilidene fluoride as main component of static electricity chuck apparatus 200 is coated with a second insulating layer 213 comprising polytetrafluoroethylene.

Next, its concrete producing method will be explained.

As an insulative parent material 212 made of resin material comprising vinilidene fluoride as a main component of the static electricity chuck apparatus 200, copolymer of vinilidene fluoride ethylene trifluoride (G150F200 produced by Central Glass Co., Ltd.) was used. As the insulative parent material 212, a uniform solution was made by dissolving G150F200 of 15 weight % into NMP 85 weight %. This solution was applied to aluminum electrode which had been subjected to almite processing and the electrode was dried for 12 hours at 100° C., thereby the thin insulative parent material 212 having film thickness of 20 μm was formed.

Next, equal amounts of dispersion liquid in which powder of polytetrafluoroethylene resin (Cefralloop I produced by Central Glass Co., Ltd.) is dispersed into 15 weight % of NMP, uniform solution obtained by dissolving 15 weight % of G150F200 into 85 weight % of NMP, and NMP are mixed and equalized and then, it was applied on a surface of the insulative parent material 212 comprising G150F200 such that it becomes a mixed film of 20 μm comprising G150F200 and polytetrafluoroethylene. This was dried for three hours at 100° C. and heated for 12 hours at 150° C. Then, dispersion liquid in which powder of 15 weight % of polytetrafluoroethylene was dispersed in the NMP was applied on a surface of the mixed film obtained in this manner such that the thickness of the polytetrafluoroethylene resin film becomes 20 μm, and it was dried for three hours at 100° C. and heated for 12 hours at 200° C.

That is, in this embodiment, the entire surface of the thin electrode 211 made of aluminum is coated with the first insulating layer 212 made of G150F200 (copolymer of vinilidene fluoride ethylene trifluoride), the entire surface of the insulating layer 212 is coated with the fourth insulating layer 215 which is the mixed film comprising the same weight ratio of polytetrafluoroethylene resin and G150F200, and its entire surface is coated with the second insulating layer 213 which is a film of 100% of polytetrafluoroethylene resin. The mixed film has high adhesion with both the polytetrafluoroethylene resin and G150F200, and strong adhesion between films can be obtained.

In order to enhance the adhesion between the outermost layer of the G150F200 and the polytetrafluoroethylene resin, polytetrafluoroethylene of low molecular weight may be interposed between the G150F200 and the outermost layer of polytetrafluoroethylene resin instead of interposing the mixed film of the G150F200 and polytetrafluoroethylene resin between the G150F200 and the outermost layer of polytetrafluoroethylene resin. There is polytetrafluoroethylene resin of low molecular weight which can be dispersed in water, and if this water dispersion type polytetrafluoroethylene resin is used, a thin film is easily formed. In addition, since the polytetrafluoroethylene resin of low molecular weight has excellent adhesion with respect to vinilidene fluoroplastics and its melting point is low, pin hole is not generated. This polytetrafluoroethylene resin of low molecular weight naturally has excellent adhesion uniformity with respect to polytetrafluoroethylene resin of high molecular weight. Further, it is not etched even under plasma atmosphere and thus, it can be used for a long term.

Moreover, in order to enhance the adhesion between the G150F200 and the outermost layer of polytetrafluoroethylene resin, the entire surface of the insulative parent material comprising G150F200, for example, may be coated with a mixed film of 75 weight % of G150F200 and 25 weight % of polytetrafluoroethylene resin as a first intermediate layer, and the entire surface may be formed with a mixed film comprising equal amounts of G150F200 and polytetrafluoroethylene resin as a second intermediate layer, and further, its entire surface may be formed with a mixed film comprising 25 weight % of G150F200 and 75 weight % of polytetrafluoroethylene resin and subsequently, the entire surface may be coated with polytetrafluoroethylene resin of high molecular weight.

In any case, since the entire surface of the static electricity chuck apparatus 200 of this embodiment is coated with polytetrafluoroethylene resin which has no pin hole and little electron deviation, the surface is not etched by ion or radical even at the time of plasma etching, and the surface has excellent durability.

Moreover, as described above, since it is possible to adjust a thermal deformation temperature by adjusting the molecular weight, even if the surface of the parent material of the static electricity chuck comprising the vinilidene fluoride resin is coated with polytetrafluoroethylene resin, the following performance with respect to the bumps and dips of the substrate is high and thin film uniformity is excellent, thus the heat transfer performance is not affected. Therefore, high heat transfer performance can be obtained between the holding stage of the static electricity chuck and the substrate to be processed. In addition, polytetrafluoroethylene resin is crystalline and thus, separation performance with respect to the substrate is also excellent.

Furthermore, in this embodiment, not only the insulative parent material 212, but also portions exposing into the plasma etching processing chamber such as the chuck support stage 3 is also coated with the polytetrafluoroethylene resin. As described above, the polytetrafluoroethylene resin is not etched by the ion or radical in the plasma atmosphere. Thereupon, in this embodiment, not only the surface which is exposed to plasma of the static electricity chuck apparatus 200, but also the chuck support stage 3 which supports and holds the static electricity chuck apparatus 200, and portions of the peripheral equipment which is exposed to plasma are coated with polytetrafluoroethylene resin. By coating such portions with polytetrafluoroethylene resin in this manner, the durability of the peripheral equipment is also enhanced, and the life of the entire apparatus is also elongated.

What is claimed is:

1. A static electricity chuck apparatus in which an electrode is disposed in an insulating layer disposed on a metal support plate, and an upper surface of the insulating layer is absorbed and held by static electricity as a holding surface of an absorbed body, wherein an upper portion of the insulating layer covering said electrode is a viscous fluid or a low-hardness gel body.

2. A static electricity chuck apparatus according to claim 1, wherein said upper portion of the insulating layer covering the electrode is mainly made of high polymer material whose phase is changed reversibly between solid phase and liquid phase depending on peripheral conditions, and said insulating layer is semi-fluidized or fluidized at least when the absorbed body is absorbed, and contacts intimately to and holds the absorbed body uniformly.

3. A static electricity chuck apparatus according to claim 1 or 2, wherein the electrode is disposed at least on a lower surface of said upper portion of the insulating layer covering the electrode.

4. A static electricity chuck apparatus according to claim 1 or 2, wherein at least when the absorbed body is absorbed, the entire insulating layer is made of gel material having low hardness.

5. A static electricity chuck apparatus according to claim 1 or 2, wherein said insulating layer comprises at least two layers, at least one of these inner layers is constituted of said viscous fluid or low-hardness gel body, and an outer surface of the layer is coated with a second insulating layer having at least a corrosion resistance property.

6. A static electricity chuck apparatus according to claim 5, wherein said insulating layer comprises at least three layers, at least one of these inner layers is constituted of viscous fluid layer or low-hardness gel body, and a third insulating layer having high insulation properties is further disposed between these insulating layers and said metal support plate.

7. A static electricity chuck apparatus according to claim 6, wherein said electrode is disposed on an upper surface of said insulating layer having high insulation properties.

8. A static electricity chuck apparatus according to claim 1 or 2, wherein said insulating layer comprises at least two layers, at least one of these inner layers is constituted of said viscous fluid or low-hardness gel body, and an outside-exposing surface of the layer is further coated with a hardening film of energy beam hardening mordant.

9. A static electricity chuck apparatus according to claim 1, wherein a surface of said electrode is subjected to compatibility processing with respect to said insulating layer.

10. A static electricity chuck apparatus according to claim 1, wherein at least one of ceramic and metal fillers are dispersed in said insulating layer.

11. A static electricity chuck apparatus according to claim 1, wherein said insulating layer comprising the low-hardness gel body is made of resin mainly comprising vinilidene fluoride.

12. A static electricity chuck apparatus according to claim 11, wherein a surface of said insulating layer is further coated with polytetrafluoroethylene resin layer.

13. A static electricity chuck apparatus according to claim 11, wherein a mixed layer of vinilidene fluoride and polytetrafluoroethylene is disposed between said insulating layer and the polytetrafluoroethylene resin layer which is the outer layer, the mixing ratio is sequentially reduced from an inner layer toward an outer layer.

14. A static electricity chuck apparatus according to claim 11, wherein molecular weight of the polytetrafluoroethylene resin layer is set to be increased stepwisely from a surface of said insulating layer toward its absorbing surface side.

15. A semiconductor producing apparatus wherein an absorbed body comprises a semiconductor substrate, and said semiconductor producing apparatus is equipped with the static electricity chuck apparatus described in claim 1.

* * * * *